(12) United States Patent
Lee et al.

(10) Patent No.: US 6,384,746 B2
(45) Date of Patent: May 7, 2002

(54) METHOD OF COMPRESSING AND RECONSTRUCTING DATA USING STATISTICAL ANALYSIS

(75) Inventors: Joo-hee Lee, Seoul; Sang-hoon Lee, Anyang, both of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/733,323

(22) Filed: Dec. 8, 2000

(30) Foreign Application Priority Data

Jan. 20, 2000 (KR) .............................. 00-2603

(51) Int. Cl.[7] .............................................. H03M 7/00
(52) U.S. Cl. ........................................................ 341/50
(58) Field of Search .................................... 341/50, 107

(56) References Cited

U.S. PATENT DOCUMENTS 5,168,375 A * 12/1992 Reisch et al. ............... 358/432
5,379,352 A * 1/1995 Sirat et al. .................... 382/41
6,058,214 A * 5/2000 Bottou et al. ............... 382/240

* cited by examiner

*Primary Examiner*—Peguy JeanPierre
(74) *Attorney, Agent, or Firm*—F. Chau & Associates, LLP

(57) ABSTRACT

A method of compressing and reconstructing a large amount of data using statistical analysis is provided. For a large amount of distribution data with respect to a relatively small number of entries having correlations, a correlation matrix and/or a factor loading matrix is obtained from the large amount of original data using a multivariate analysis and stored as compressed data. Data having the format and tendency of the original data is reconstructed using the factor loading matrix and a random-number matrix. Accordingly, data can be compressed to a predetermined capacity and then reconstructed regardless of the amount of data, advantageously allowing for efficient management of a large amount of data.

23 Claims, 3 Drawing Sheets

METHOD OF COMPRESSING AND RECONSTRUCTING DATA USING STATISTICAL ANALYSIS

BACKGROUND OF THE INVENTION

1. Field of the Invention

The present invention relates to a method of compressing and reconstructing a large amount of data, and more particularly, to a method of compressing and reconstructing data using statistical analysis.

2. Description of the Related Art

When transmitting or storing a large amount of data, data is generally compressed according to a predetermined rule to reduce transmission time or storage space, and the compressed data is decompressed to reconstruct the original data. Compression and reconstruction is performed such that the reconstructed data is entirely identical to the original data. Accordingly, even though compression efficiency varies with the compression/decompression algorithm or data format, there is a limitation in improving the compression efficiency.

However, in some cases it is not necessary for the original data to be reconstructed identically; only the tendencies between the original data and the reconstructed data are needed. For example, for electrical test data of a semiconductor device which is measured in every process during manufacture of the device, the number of entries is relatively small (e.g., several entries to several hundred entries). However, sometimes it is necessary to measure several thousand to several tens of thousands of lines of data to detect tendencies or the distribution of the characteristics of devices, which have slight variations even if identical devices are manufactured under the same conditions. In this case, the overall tendency or distribution is more important than a specific value of data at a certain line in a certain entry. Moreover, for such a large amount of data, it is difficult to understand the correlation between entries and the distribution of data in an initial data format. In addition, it is not easy to store, accumulate and manage such a large amount of data for an extensive period of time.

Typically, the average value and standard deviation are measured to understand the tendency and distribution of a large amount of data, or information, such as correlation, is obtained using statistical analysis. However, a need exists for a method of compressing a large amount of data and reconstructing original data from the compressed data.

SUMMARY OF THE INVENTION

An object of the present invention is to provide a method of compressing a large amount of data and reconstructing the compressed data in an original data format using statistical analysis.

In an aspect of the present invention, a method is provided for compressing and reconstructing original data having n rows×m entries, which are correlated to one another, using statistical analysis, wherein the n rows are correlated to the m entries and m<n. The method includes the steps of (a) obtaining a correlation matrix C having m rows×m columns, wherein the correlation matrix C includes correlation coefficients between the m entries, (b) obtaining eigenvectors and eigenvalues of the correlation coefficients in the correlation matrix C, (c) obtaining a factor loading matrix F having m rows×p columns from the eigenvectors and the eigenvalues using a multivariate analysis, wherein p is a natural number less than or equal to the m entries, (d) generating random numbers to form a random-number matrix having l rows×p columns, wherein l is the number of rows to be reconstructed with respect to the m entries, (e) obtaining an intermediate data matrix having l rows×m columns including correlation information by multiplying the random-number matrix by a transposed matrix of the factor loading matrix F, and (f) scaling the intermediate data matrix according to a scale of the original data to obtain a reconstructed data matrix comprised of elements in l rows×m columns, whereby the reconstructed data matrix has a format of the original data.

In another aspect of the present invention, the factor loading matrix F is stored as compressed data, and reconstruction is performed by steps (d) through (f). That is, steps (a) through (c) are for data compression and steps (d) through (f) are for data reconstruction.

In yet another aspect of the present invention, the correlation matrix C and the factor loading matrix F are stored as compressed data, and reconstruction is performed by steps (d) through (f).

In yet another aspect, the correlation matrix C obtained in step (a) is stored as compressed data, and data having the original data format can be reconstructed by steps (b) through (f). That is, the step (a) is for data compression, and the steps (b) through (f) are for data reconstruction.

According to an aspect of the present invention, a large amount of original data having n rows and m columns (n>>m) can be compressed to a correlation matrix having m rows and m columns or to a factor loading matrix having m rows and p columns, and data having the tendency and format of the original data can be reconstructed using a random-number matrix and the factor loading matrix, in a simple way.

These and other aspects, features and advantages of the present invention will be described or become apparent from the following detailed description of the preferred embodiments, which is to be read in connection with the accompanying drawings.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

It is to be understood that the exemplary system modules and method steps described herein may be implemented in various forms of hardware, software, firmware, special purpose processors, or a combination thereof. Preferably, the present invention is implemented in software as an application program tangibly embodied on one or more program storage devices. The application program may be executed by any machine, device or platform comprising suitable architecture. It is to be further understood that, because some of the constituent system modules and method steps depicted in the accompanying Figures are preferably implemented in software, the actual connections between the system components (or the process steps) may differ depending upon the manner in which the present invention is programmed. Given the teachings herein, one of ordinary skill in the related art will be able to contemplate these and similar implementations or configurations of the present invention.

Figure 1:
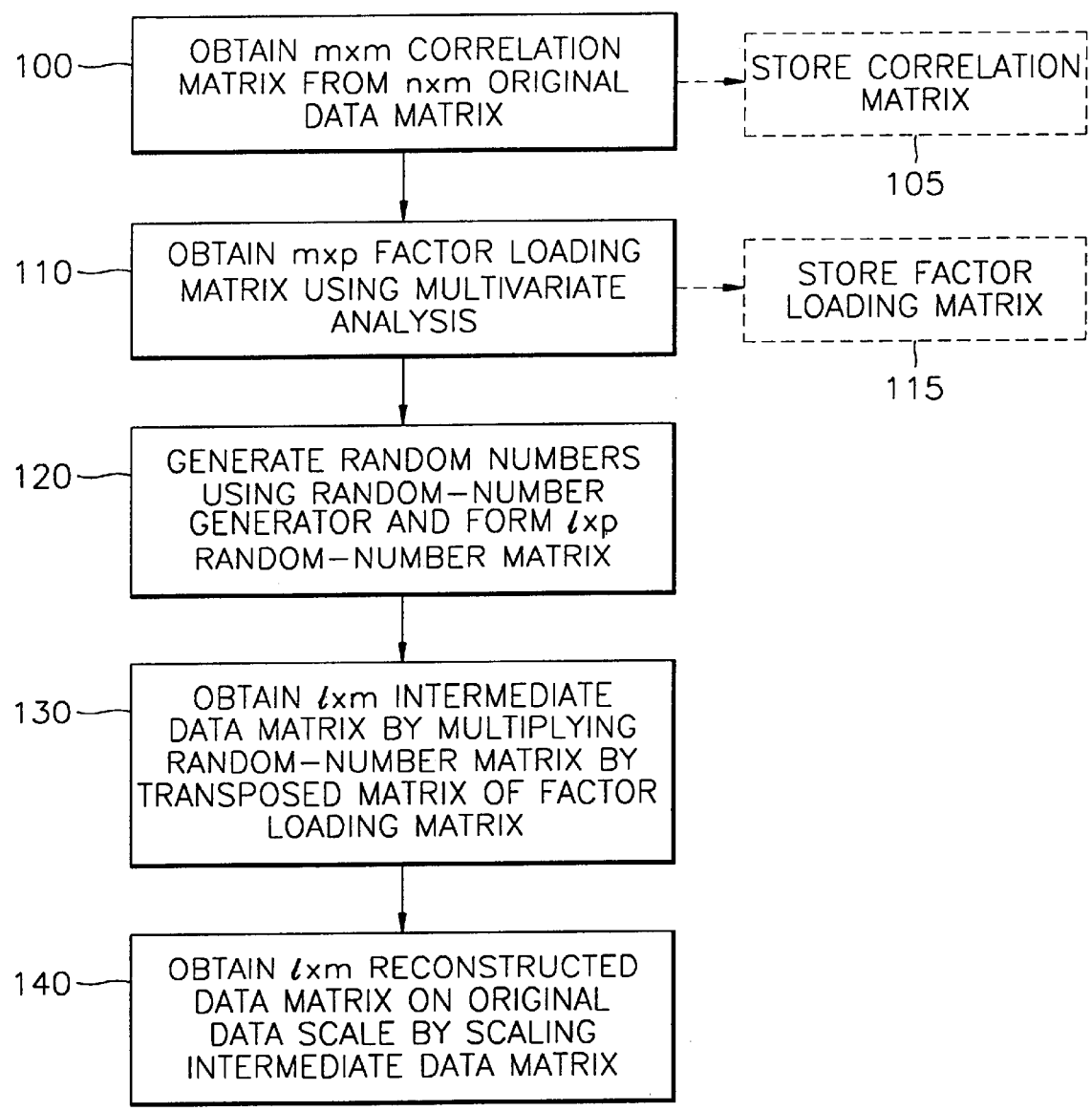
FIG. 1 is a flowchart of a method of data compression and reconstruction according to the present invention.
Figure 2:
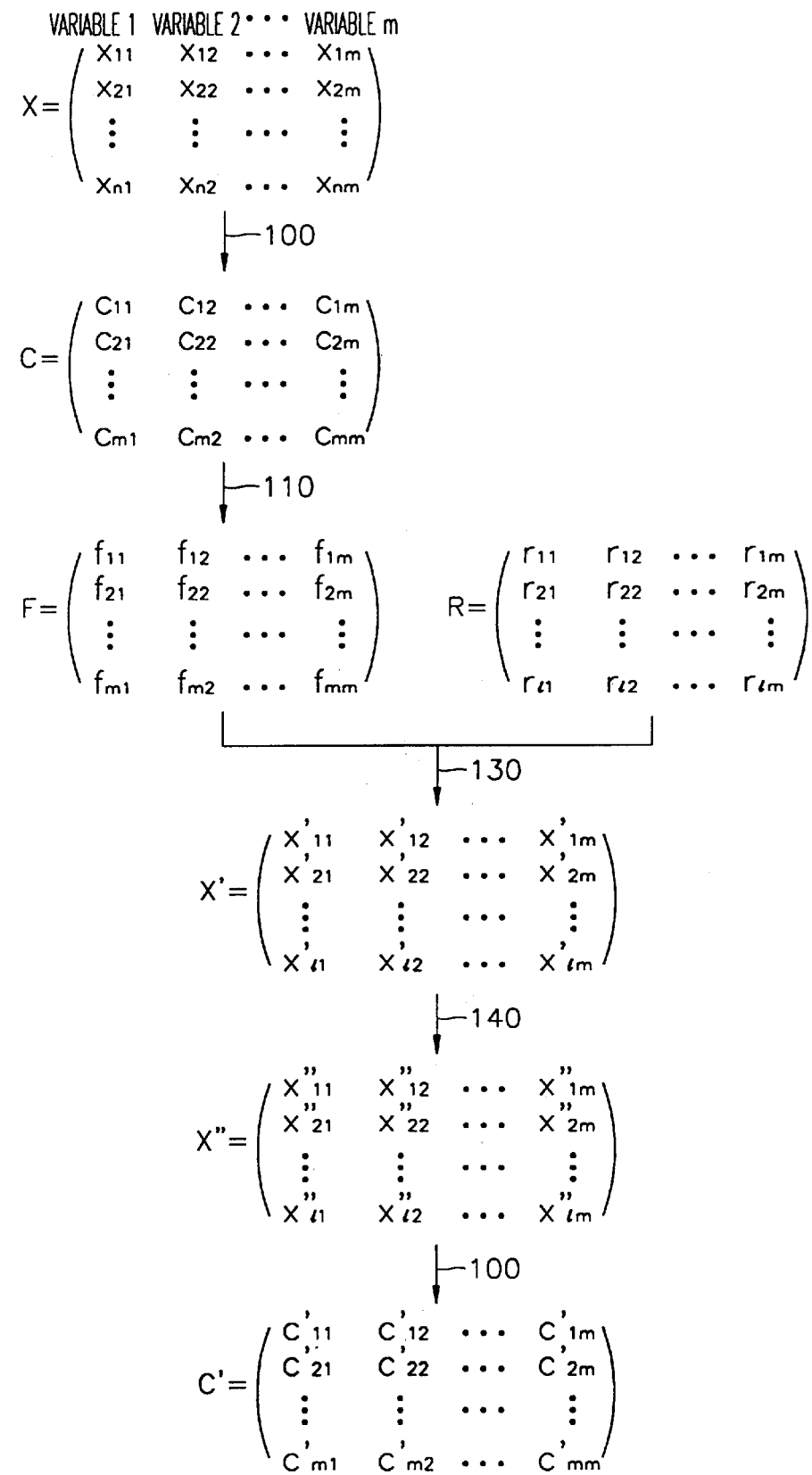
FIG. 2 shows transformation of data in a method of data compression and reconstruction according to the present invention.

With reference to the flowchart of FIG. 1 and FIG. 2 showing transformation of original (or "initial") data to compressed data and then to reconstructed data, a procedure of compressing and reconstructing data according to an aspect of the present invention will be described.

As shown in FIG. 2, correlation coefficients between entries (variables) are measured from an original data matrix X having n rows and m columns (n>>m) to obtain a correlation matrix C having m rows and m columns in step 100. A correlation coefficient $c_{ij}$ between an i-th column (a variable i) and a j-th column (a variable j) in the original data matrix X is an element at an i-th row and a j-th column in the correlation matrix C and obtained by Equation 1.

$$c_{ij} = \sum_{k=1}^{n}\left(\frac{x_{ki}-\bar{x}_i}{\sqrt{n}\cdot\sigma_i}\right)\left(\frac{x_{kj}-\bar{x}_j}{\sqrt{n}\cdot\sigma_j}\right) = \sum_{k=1}^{n}\frac{(x_{ki}-\bar{x}_i)(x_{kj}-\bar{x}_j)}{n(\sigma_i\sigma_j)} \quad (1)$$

where i and j are integers less than or equal to m, which indicate the row and the column, respectively, of the correlation matrix C, $x_{ki}$ is an element at a k-th row and i-th column in the original data matrix X, $x_{kj}$ is an element at a k-th row and j-th column in the original data matrix X, $\bar{x}_i$ and $\sigma_i$ are the average and standard deviation, respectively, of the i-th column in the original data matrix X, and $\bar{x}_j$ and $\sigma_j$ are the average and standard deviation, respectively, of the j-th column in the original data matrix X.

The correlation matrix C itself, obtained through the above operation, is compressed data and may be stored in a predetermined storage medium in step 105. In addition, basic statistical data including the averages and standard deviations of entries (variables) is also stored.

Thereafter, a factor loading matrix F having m rows and p columns is obtained from the m×m correlation matrix C using a multivariate analysis in step 110. The factor loading matrix F is composed of factor loadings necessary for reconstructing data into the original data format. Here, p is the number of factors and is less than or equal to the number m of the variable (entries).

To obtain the factor loading matrix F, the eigenvalues and eigenvectors of the correlation matrix C are obtained from the correlation matrix C. Then, the factor loading matrix F is obtained by Equation 2.

$$f_i = \sqrt{|\lambda_i|}\cdot\alpha_i \quad (2)$$

where i is an integer less than or equal to m, $f_i$ is a vector of the i-th row in the factor loading matrix F, $\lambda_i$ is an eigenvalue in the correlation matrix C, and $\alpha_i$ is an eigenvector in the correlation matrix C.

The factor loading matrix F itself, obtained through the above operation, is compressed data and may be stored in a predetermined storage medium individually or together with the correlation matrix C in step 115.

In other words, data which is compressed according to a method of compression and reconstruction of the present invention may include either the correlation matrix C or the factor loading matrix F, or may include both the correlation matrix C and the factor loading matrix F. When only the correlation matrix C is stored as the compressed data, steps 100 and 105 are performed for compression and storing. Step 110 and steps thereafter are performed for reconstruction. When the factor loading matrix F is stored as the compressed data, steps 100 through 115 are performed for compression and storing, and step 120 and steps thereafter are performed for reconstruction. In any case, an n×m matrix (n>>m) of the original data is compressed to an m×m matrix or an m×p matrix. That is, regardless of the number of lines in the original data, the original data is compressed to a matrix having as many rows and columns as the data entries (variables) or less. Consequently, the compression ratio becomes $$\frac{m(\text{or }p)}{n}\times 100(\%),$$

and the compression ratio becomes better as n increases.

Thereafter, a procedure of reconstructing data from the factor loading matrix F in the original data format is provided according to an aspect of the present invention. Random numbers −1 to +1 are generated to form a random-number matrix R having l rows and p columns in step 120. Here, l is the number of lines of data to be reconstructed and may be a predetermined natural number or n as in the original data.

Subsequently, the random-number matrix R is multiplied by the transposed matrix $F^t$ of the factor loading matrix F to obtain an intermediate data matrix X' in step 130. That is, each element $x'_{ij}$ in the intermediate data matrix X' is obtained by Equation 3.

$$x'_{ij} = \sum_{k=1}^{p} r_{ik}f_{jk} \quad (3)$$

where i and j are integers less than or equal to l and m, respectively, which indicate the row and the column, respectively, of the intermediate data matrix X', $r_{ik}$ is an element at an i-th row and k-th column in the random-number matrix R, and $f_{jk}$ is an element at a j-th row and k-th column in the factor loading matrix F.

Since the intermediate data matrix X' is obtained by multiplying the random-number matrix R by the transposed matrix $F^t$ of the factor loading matrix F, it includes correlation information and has a similar distribution to that of the original data format. However, the intermediate data matrix X' is different from the original data in scale. Accordingly, the intermediate data matrix X' is scaled on the original data scale, thereby obtaining a final reconstructed data matrix X" having the original data format in step 140.

In scaling the intermediate data matrix X' to the final reconstructed data matrix X", the averages and standard deviation stored by the entries (variables) are used in addition to the compressed data (the correlation matrix C and/or the factor loading matrix F). That is, each element $x''_{ij}$ in the final reconstructed data matrix X" is obtained by Equation 4.

$$x''_{ij} = x'_{ij}\times\sigma_j + \bar{x}_j \quad (4)$$

where i and j are integers less than or equal to l and m respectively, which indicate the row and the column, respectively, of the final reconstructed data matrix X", $x''_{ij}$ is an element at an i-th row and j-th column in the final reconstructed data matrix X", $x'_{ij}$ is an element at an i-th row and j-th column in the intermediate data matrix X', and $\overline{\chi}_j$ and $\sigma_j$ are the average and standard deviation, respectively, of the j-th column (the j-th variable) in the original data matrix X.

Even if the specific value of this final reconstructed data matrix X" is not the same as that of the original data, the overall tendency of the final reconstructed data matrix X" is the same as that of the original data.

Meanwhile, the accuracy of the reconstructed data can be tested by comparing the correlation matrix C of the original data with the correlation matrix C', which is obtained by performing step 100 with respect to the final reconstructed data matrix X", of the reconstructed data. In addition, the accuracy of the reconstructed data can be tested by comparing the factor loading matrix F of the original data with the factor loading matrix F' of the original data. F' can be obtained by performing step 110 with respect to the correlation matrix C' of the reconstructed data.

The following description concerns an application example in which a method of data compression and reconstruction according to the present invention is applied to specific, physical data.

In this application example, data, which was obtained by measuring 3000 times (rows): the threshold voltage $V_{TN}$ of an NMOS transistor, the drain saturation current $I_{DN}$ of the NMOS transistor, the threshold voltage $V_{TP}$ of a PMOS transistor and the drain saturation current $I_{DP}$ of the PMOS transistor in the electrical test data of a semiconductor device, was compressed to a correlation matrix having 4 rows and 4 columns and to a factor loading matrix having 4 rows and 4 columns, and then reconstructed. An original data matrix in this application example can be represented, as shown in Table 1.

TABLE 1

| $V_{TN}$ | $I_{DN}$ | $V_{TP}$ | $I_{DP}$ |
|---|---|---|---|
| 0.58 | 2.02 | 0.73 | 0.95 |
| . | . | . | . |
| . | . | . | . |
| . | . | . | . |
| 0.55 | 1.95 | 0.69 | 0.92 |

Step 100 of FIG. 1 was performed on the above original data matrix having 3000 rows and 4 columns, thereby obtaining a correlation matrix having 4 rows and 4 columns, as shown in Table 2.

TABLE 2

| | $V_{TN}$ | $I_{DN}$ | $V_{TP}$ | $I_{DP}$ |
|---|---|---|---|---|
| $V_{TN}$ | 1 | −0.774 | −0.236 | −0.253 |
| $I_{DN}$ | −0.774 | 1 | −0.018 | 0.654 |
| $V_{TP}$ | −0.236 | −0.018 | 1 | −0.603 |
| $I_{DP}$ | −0.253 | 0.654 | −0.603 | 1 |

Each correlation coefficient in the correlation matrix of Table 2 has a value of −1 to +1. A plus sign indicates positive correlation, and a minus sign indicates negative correlation.

Next, step 110 was performed on the correlation matrix, thereby obtaining a factor loading matrix having 4 rows and 4 columns, as shown in Table 3.

TABLE 3

| | Factor 1 | Factor 2 | Factor 3 | Factor 4 |
|---|---|---|---|---|
| $V_{TN}$ | −0.32 | 0.10 | 0.59 | −0.73 |
| $I_{DN}$ | −0.14 | 0.19 | −0.25 | 0.94 |
| $V_{TP}$ | −0.30 | −0.07 | −0.91 | −0.29 |
| $I_{DP}$ | −0.23 | −0.15 | 0.49 | 0.82 |

The correlation matrix shown in Table 2 and/or the factor loading matrix shown in Table 3 can be stored in a predetermined storage medium as compressed data.

Figure 3:
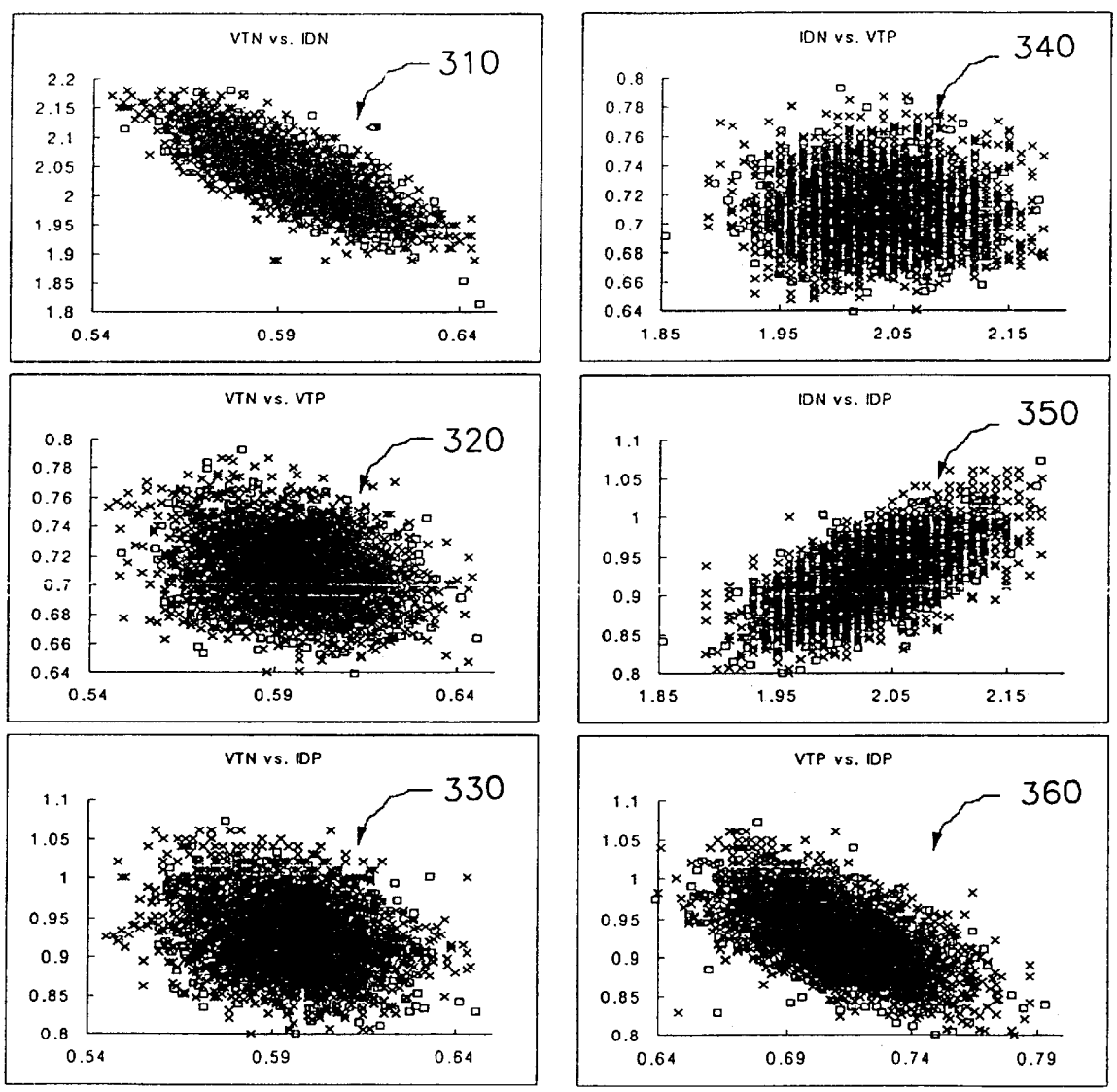
FIG. 3 shows graphs in which a correlation between entries of original data before compression and a correlation between entries of data, which is compressed and then reconstructed according to a method of the present invention, overlap each other and float.

To reconstruct data having an original data format from the factor loading matrix of Table 3, steps 120 through 140 were performed. The results obtained by performing the steps 120 through 140 are shown in FIG. 3. FIG. 3 shows correlation graphs in which original data having 3000 rows and reconstructed data having 1000 rows overlap each other and float. In FIG. 3, the original data is represented by "x", and the reconstructed data is represented by "□". Reference numerals 310 through 360 indicate a correlation between $V_{TN}$ and $I_{DN}$, a correlation between $V_{TN}$ and $V_{TP}$, a correlation between $V_{TN}$ and $I_{DP}$, a correlation between $I_{DN}$ and $V_{TP}$, a correlation between $I_{DN}$ and $I_{DP}$, and a correlation between $V_{TP}$ and $I_{DP}$, respectively. As is evident from FIG. 3, the tendency of the original data substantially comports with the tendency of the reconstructed data.

Meanwhile, a correlation matrix and a factor loading matrix were obtained with respect to the reconstructed data and compared with the correlation matrix and the factor loading matrix of the original data, respectively. The correlation matrix and the factor loading matrix of the reconstructed data having 1000 rows are shown in Tables 4 and 5, respectively.

TABLE 4

| | $V_{TN}$ | $I_{DN}$ | $V_{TP}$ | $I_{DP}$ |
|---|---|---|---|---|
| $V_{TN}$ | 1 | −0.770 | −0.230 | −0.254 |
| $I_{DN}$ | −0.770 | 1 | −0.000 | 0.649 |
| $V_{TP}$ | −0.230 | −0.000 | 1 | −0.607 |
| $I_{DP}$ | −0.254 | 0.649 | −0.607 | 1 |

TABLE 5

| | Factor 1 | Factor 2 | Factor 3 | Factor 4 |
|---|---|---|---|---|
| $V_{TN}$ | −0.34 | 0.19 | 0.58 | −0.74 |
| $I_{DN}$ | −0.15 | 0.18 | −0.25 | 0.94 |
| $V_{TP}$ | −0.29 | −0.08 | −0.91 | −0.28 |
| $I_{DP}$ | −0.23 | −0.16 | 0.50 | 0.82 |

When obtaining relative errors by comparing the correlation matrix shown in Table 2 with the correlation matrix shown in Table 4 to understand the accuracy of the reconstructed data, it is to be appreciated that the accuracy is very high such that in descending order of the absolute values of correlation coefficients of data entries, the relative error between $V_{TN}$ and $I_{DN}$ is 0.5%, the relative error between $I_{DN}$ and $I_{DP}$ is 0.8%, and the relative error between $V_{TP}$ and $I_{DP}$ is 0.7%. The relative error is obtained by Equation 5.

$$\text{Relative error} = \quad (5)$$

$$\frac{|\text{Correlation coefficient of original data} - \text{Correlation coefficient of reconstructed data}|}{|\text{Correlation coefficeint of original data}|} \times 100\,(\%)$$

When obtaining relative errors by comparing the factor loading matrix shown in Table 3 with the factor loading matrix shown in Table 5, it is evident that the accuracy of the reconstructed data is very high such that the relative error of the factor 3 of $V_{TP}$, which is an entry having the largest absolute value of a factor loading, is 0%, and the average relative error of the entries having absolute values of 0.25 or more is 1.8%.

In the above application example, the present invention is applied to the compression and reconstruction of the electrical test data of a semiconductor device, but is not restricted thereto. For example, the present invention can be applied to any data having a correlation such as meteorological data including temperature, wind direction, wind velocity and rainfall.

As described above, according to an aspect of the present invention, a large amount of data can be compressed to a correlation matrix or a factor loading matrix, and this matrix is stored. Data having the tendency of the original data can be reconstructed from this stored matrix. Advantageously, a method of the present invention can reconstruct data after compressing the data to a predetermined capacity regardless of the amount of the data, thereby efficiently managing a large amount of data.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method of compressing and reconstructing original data having n rows×m entries using statistical analysis, wherein the n rows are correlated to the m entries and m<n, the method comprising the steps of:
   (a) obtaining a correlation matrix C having m rows×m columns, wherein the correlation matrix C is comprised of correlation coefficients between the m entries;
   (b) obtaining eigenvectors and eigenvalues of the correlation coefficients in the correlation matrix C;
   (c) obtaining a factor loading matrix F having m rows×p columns from the eigenvectors and the eigenvalues using a multivariate analysis, wherein p is a natural number less than or equal to the m entries;
   (d) generating random numbers to form a random-number matrix having l rows×p columns, wherein l is the number of rows to be reconstructed with respect to the m entries;
   (e) obtaining an intermediate data matrix having l rows×m columns by multiplying the random-number matrix by a transposed matrix of the factor loading matrix F; and
   (f) scaling the intermediate data matrix according to a scale of the original data to obtain a reconstructed data matrix comprised of elements in l rows×m columns, whereby the reconstructed data matrix has a format of the original data.

2. The method of claim 1, wherein each correlation coefficient in the correlation matrix C is obtained by the equation:

$$c_{ij} = \sum_{k=1}^{n} \frac{(x_{ki} - \bar{x}_i)(x_{kj} - \bar{x}_j)}{n(\sigma_i \sigma_j)}$$

where i and j are natural numbers less than or equal to m, which indicate the row and the column, respectively, of the correlation matrix C, $c_{ij}$ is a correlation coefficient between an i-th entry and a j-th entry in the original data and is an element at an i-th row and j-th column in the correlation matrix C, $x_{ki}$ is an element at a k-th row and i-th column in the original data, $x_{kj}$ is an element at a k-th row and a j-th column in the original data, $\bar{x}_i$ and $\sigma_i$ are an average and a standard deviation, respectively, of the i-th column in the original data, and $\bar{x}_j$ and $\sigma_j$ are the average and standard deviation, respectively, of the j-th column in the original data.

3. The method of claim 1, wherein the factor loading matrix F is obtained by the equation:

$$f_i = \sqrt{|\lambda_i|} \cdot \alpha_i$$

where i is an integer less than or equal to m, $f_i$ is a vector of the i-th row in the factor loading matrix F, $\lambda_i$ is an eigenvalue in the correlation matrix C, and $\alpha_i$ is an eigenvector in the correlation matrix C.

4. The method of claim 1, wherein each element in the intermediate data matrix is obtained by the equation:

$$x'_{ij} = \sum_{k=1}^{p} r_{ik} f_{jk}$$

where i and j are integers less than or equal to l and m respectively, and l and m indicate a row and a column, respectively, of the intermediate data matrix X', $r_{ik}$ is an element at an i-th row and k-th column in the random-number matrix R, and $f_{jk}$ is an element at a j-th row and k-th column in the factor loading matrix F.

5. The method of claim 1, wherein each element in the reconstructed data matrix having the format of the original data is obtained by the equation:

$$x''_{ij} = x'_{ij} \times \sigma_j + \bar{x}_j$$

where i and j are integers less than or equal to the l rows and the m columns, respectively, of the reconstructed data matrix, $x''_{ij}$ is an element at an i-th row and j-th column in the reconstructed data matrix, $x'_{ij}$ is an element at an i-th row and j-th column in the intermediate data matrix, and $\bar{x}_j$ and $\sigma_j$ are an average and a standard deviation, respectively, of a j-th column in the original data.

6. The method of claim 1, wherein the correlation matrix C is stored as compressed data, and reconstruction is performed by steps (b) through (f).

7. The method of claim 1, wherein the factor loading matrix F is stored as compressed data, and reconstruction is performed by steps (d) through (f).

8. The method of claim 1, further comprising the step of obtaining a correlation matrix C' by measuring correlation coefficients of the reconstructed data matrix, wherein accuracy of reconstructed data is tested by comparing the correlation matrix C' with the correlation matrix C.

9. The method of claim 8, further comprising the step of performing the multivariate analysis on the correlation matrix C' to obtain a factor loading matrix F', wherein accuracy of reconstructed data is tested by comparing the factor loading matrix F' to the factor loading matrix F.

10. A method of compressing and reconstructing original data, the original data having n rows with respect to m entries, the method comprising the steps of:
   compressing the original data to form a correlation matrix having m rows×m columns;
   building a factor loading matrix having m rows × p columns from the correlation matrix using a multivariate analysis;
   forming a random number matrix by generating random numbers, the random number matrix having l rows×p columns, wherein l is a number of lines of the original data to be reconstructed;
   building an intermediate data matrix comprised of intermediate elements in l rows×p columns; and
   obtaining a reconstructed data matrix comprised of reconstructed elements by scaling the intermediate data matrix to a scale of the original data.

11. The method of claim 10, wherein the correlation matrix is comprised of correlation coefficients, the correlation coefficients being determined by the equation:

$$c_{ij} = \sum_{k=1}^{n} \frac{(x_{ki} - \overline{x}_i)(x_{kj} - \overline{x}_j)}{n(\sigma_i \sigma_j)}$$

where i and j are integers less than or equal to m, $c_{ij}$ is a correlation coefficient between an i-th entry and a j-th entry in the original data and is an element at an i-th row and j-th column in the correlation matrix, $X_{ki}$ is an element at a k-th row and i-th column in the original data, $x_{kj}$ is an element at a k-th row and a j-th column in the original data, $\overline{\chi}_i$ and $\sigma_i$ are an average and a standard deviation, respectively, of the i-th column in the original data, and $\overline{\chi}_j$ and $\sigma_j$ are an average and a standard deviation, respectively, of the j-th column in the original data.

12. The method of claim 10, wherein the factor loading matrix is built using the equation:

$$f_i = \sqrt{|\lambda_i|} \cdot \alpha_i$$

where i is an integer less than or equal to m, $f_i$ is a vector of an i-th row in the factor loading matrix, $\lambda_i$ is an eigenvalue in the correlation matrix, and $\alpha_i$ is an eigenvector in the correlation matrix.

13. The method of claim 10, wherein each of the intermediate elements in the intermediate data matrix is obtained by the equation:

$$x'_{ij} = \sum_{k=1}^{p} r_{ik} f_{jk}$$

where i and j are integers less than or equal to l and m respectively, and l and m indicate a row and a column, respectively, of the intermediate data matrix X', $r_{ik}$ is an element at an i-th row and a k-th column in the random number matrix, and $f_{jk}$ is an element at a j-th row and a k-th column in the factor loading matrix.

14. The method of claim 10, wherein each of the reconstructed elements in the reconstructed data matrix is obtained by the equation:

$$x''_{ij} = x'_{ij} \times \sigma_j + \overline{\chi}_j$$

where i and j are integers less than or equal to the l rows and the m columns, respectively, of the reconstructed data matrix, $x''_{ij}$ is an element at an i-th row and a j-th column in the reconstructed data matrix, $x'_{ij}$ is an element at an i-th row and a j-th column in the intermediate data matrix, and $\overline{\chi}_j$ and $\sigma_j$ j are an average and a standard deviation, respectively, of a j-th column in the original data.

15. The method of claim 10, further comprising the step of obtaining a correlation matrix C' by measuring correlation coefficients of the reconstructed data matrix, wherein accuracy of reconstructed data is tested by comparing the correlation matrix C' with the correlation matrix.

16. The method of claim 15, further comprising the step of performing the multivariate analysis on the correlation matrix C' to obtain a factor loading matrix F', wherein accuracy of reconstructed data is tested by comparing the factor loading matrix F' to the factor loading matrix.

17. A program storage device readable by a machine, tangibly embodying a program of instructions executable by the machine to perform the method steps for compressing and reconstructing original data having n rows×m entries using statistical analysis, wherein the n rows are correlated to the m entries and m<n, the method comprising the steps of:
   (a) obtaining a correlation matrix C having m rows×m columns, wherein the correlation matrix C is comprised of correlation coefficients between the m entries;
   (b) obtaining eigenvectors and eigenvalues of the correlation coefficients in the correlation matrix C;
   (c) obtaining a factor loading matrix F having m rows×p columns from the eigenvectors and the eigenvalues using a multivariate analysis, wherein p is an integer less than or equal to the m entries;
   (d) generating random numbers to form a random-number matrix having l rows×p columns, wherein l is the number of rows to be reconstructed with respect to the m entries;
   (e) obtaining an intermediate data matrix having l rows×m columns by multiplying the random-number matrix by a transposed matrix of the factor loading matrix F; and
   (f) scaling the intermediate data matrix according to a scale of the original data to obtain a reconstructed data matrix comprised of elements in l rows×m columns, whereby the reconstructed data matrix has a format of the original data.

18. The program storage device of claim 17, wherein each correlation coefficient in the correlation matrix C is obtained by the equation:

$$c_{ij} = \sum_{k=1}^{n} \frac{(x_{ki} - \overline{x}_i)(x_{kj} - \overline{x}_j)}{n(\sigma_i \sigma_j)}$$

where i and j are natural numbers less than or equal to m, which indicate the row and the column, respectively, of the correlation matrix C, $c_{ij}$ is a correlation coefficient between an i-th entry and a j-th entry in the original data and is an element at an i-th row and j-th column in the correlation matrix C, $x_{ki}$ is an element at a k-th row and i-th column in the original data, $x_{kj}$ is an element at a k-th row and a j-th column in the original data, $\overline{\chi}_i$ and $\sigma_i$ are an average and a standard deviation, respectively, of the i-th column in the original data, and $\overline{\chi}_j$ and $\sigma_j$ are the average and standard deviation, respectively, of the j-th column in the original data.

19. The program storage device of claim 17, wherein the factor loading matrix F is obtained by the equation:

$$f_i = \sqrt{|\lambda_i|} \cdot \alpha_i$$

where i is an integer less than or equal to m, $f_i$ is a vector of the i-th row in the factor loading matrix F, $\lambda_i$ is an eigenvalue in the correlation matrix C, and $\alpha_i$ is an eigenvector in the correlation matrix C.

20. The program storage device of claim 17, wherein each element in the intermediate data matrix is obtained by the equation:

$$x'_{ij} = \sum_{k=1}^{p} r_{ik} f_{jk}$$

where i and j are integers less than or equal to l and m respectively, and l and m indicate a row and a column, respectively, of the intermediate data matrix X', $r_{ik}$ is an element at an i-th row and k-th column in the random-number matrix R, and $f_{jk}$ is an element at a j-th row and k-th column in the factor loading matrix F.

21. The program storage device of claim 17, wherein each element in the reconstructed data matrix having the format of the original data is obtained by the equation:

$$x''_{ij} = x'_{ij} \times \sigma_j + \bar{\chi}_j$$

where i and j are integers less than or equal to the l rows and the m columns, respectively, of the reconstructed data matrix, $x''_{ij}$ is an element at an i-th row and j-th column in the reconstructed data matrix, $x'_{ij}$ is an element at an i-th row and j-th column in the intermediate data matrix, and $\bar{\chi}_j$ and $\sigma_j$ are an average and a standard deviation, respectively, of a j-th column in the original data.

22. The program storage device of claim 17, further comprising the step of obtaining a correlation matrix C' by measuring correlation coefficients of the reconstructed data matrix, wherein accuracy of reconstructed data is tested by comparing the correlation matrix C' with the correlation matrix C.

23. The program storage device of claim 22, further comprising the step of performing the multivariate analysis on the correlation matrix C' to obtain a factor loading matrix F', wherein accuracy of reconstructed data is tested by comparing the factor loading matrix F' to the factor loading matrix F.

* * * * *